(12) United States Patent
Kikuchi et al.

(10) Patent No.: US 7,087,961 B2
(45) Date of Patent: Aug. 8, 2006

(54) SEMICONDUCTOR DEVICE WITH REDUCED ON-STATE RESISTANCE

(75) Inventors: Shuichi Kikuchi, Gunma (JP); Eiji Nishibe, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 19 days.

(21) Appl. No.: 10/651,855

(22) Filed: Aug. 29, 2003

(65) Prior Publication Data
US 2004/0051125 A1    Mar. 18, 2004

Related U.S. Application Data

(62) Division of application No. 09/789,163, filed on Feb. 20, 2001, now Pat. No. 6,638,827.

(30) Foreign Application Priority Data

Apr. 26, 2000 (JP) .......................... P. 2000-125379
Nov. 22, 2000 (JP) .......................... P. 2000-356043

(51) Int. Cl.
*H01L 29/76* (2006.01)
(52) U.S. Cl. .................. 257/341; 257/401; 257/408
(58) Field of Classification Search ................ 257/341, 257/288, 401, 408
See application file for complete search history.

(56) References Cited

U.S. PATENT DOCUMENTS

| 4,290,077 A | 9/1981 | Ronen |
| 5,229,308 A | 7/1993 | Vo et al. |
| 5,328,859 A * | 7/1994 | Vo et al. ........................ 438/374 |
| 5,932,897 A * | 8/1999 | Kawaguchi et al. ......... 257/141 |
| 6,198,131 B1 * | 3/2001 | Tung ............................ 257/345 |
| 6,306,711 B1 * | 10/2001 | Yang ............................ 438/286 |

FOREIGN PATENT DOCUMENTS

| JP | 60-198780 | 10/1985 |
| JP | S60-198780 | 10/1985 |
| JP | 5-343675 | 7/1993 |
| JP | H06-120497 | 4/1994 |
| JP | 7-283409 | 10/1995 |
| JP | H10-506755 | 6/1998 |

OTHER PUBLICATIONS

Korean Office Action dated Sep. 26, 2002.

* cited by examiner

*Primary Examiner*—Thanh Nguyen
(74) *Attorney, Agent, or Firm*—Fish & Richardson P.C.

(57) ABSTRACT

To enable the reduction of ON-state resistance in a state in which the withstand voltage is secured, a semiconductor device according to the invention is provided with a gate electrode formed so that the gate electrode ranges from a gate oxide film formed on an N-type well region formed in a P-type semiconductor substrate to a selective oxide film, a P-type source region formed so that the source region is adjacent to the gate electrode, a P-type drain region formed in a position apart from the gate electrode and a P-type drift region (an LP layer) formed so that the drift region surrounds the drain region, and is characterized in that a P-type impurities layer (an FP layer) is formed so that the impurities layer is adjacent to the drain region.

7 Claims, 8 Drawing Sheets ns of the drift region (the LP layer 53) cannot be reduced more.
SEMICONDUCTOR DEVICE WITH REDUCED ON-STATE RESISTANCE This is a divisional from a parent application Ser. No. 09/789,163 filed Feb. 20, 2001, now U.S. Pat. No. 6,638,827 which, in turn, claims the benefit of Japanese application serial nos. 2000-125379 filed Apr. 26, 2000 and 2000-356043 filed Nov. 22, 2000.

BACKGROUND OF THE INVENTION

1. Field of the Invention

The present invention relates to a semiconductor device and a method of manufacturing it, further detailedly relates to technique for reducing ON-state resistance without reducing the withstand voltage of a high-withstand voltage MOS transistor.

2. Description of the Related Art

Referring to the drawings, a conventional type semiconductor device, particularly P-channel type MOS transistor will be described below.

As shown in FIG. 15, a reference number 51 denotes a P-type semiconductor substrate(Psub) for example, 52 denotes an N-type well region (NW) and an LP layer 53A (composing a drift region) is formed in the N-type well region 52. Reference numbers 54A and 54B respectively denote a selective oxide film (for forming a gate oxide film) and a local oxide film (composing an element isolation film) respectively formed by LOCOS(Local Oxidation of Silicon).

A reference number 55 denotes a gate oxide film, 56 denotes a gate electrode formed so that the gate electrode ranges from the gate oxide film 55 to the selective oxide film 54A, and 57A and 58A denote an P⁺type source region formed so that it is adjacent to the gate electrode 56 and an P⁺type drain region formed in a position apart from the gate electrode 56.

The conventional type semiconductor device adopts LDD structure including the drift region (the LP layer 53A) deep diffused so that the drift region surrounds the drain region 58 to increase the withstand voltage as shown in FIG. 15.

However, there is a correlation shown in FIG. 16 between the density of the drift region (the LP layer 53A) and the withstand voltage (BVDS) between the source and the drain, therefore, the upper limit value exists for the density of the drift region (the LP layer 53A) and the resistance value of the drift region (the LP layer 53) cannot be reduced more.

Now referring to the drawings, an explanation will be given of a conventional semiconductor device, particularly an N-channel type MOS transistor. The explanation of the same structure as the above P-channel type MOS transistor will be replaced by the same reference symbols.

As seen from FIG. 17, an LN (lightly doped N-type) layer 53B which constitutes a drift region) is formed in e.g. a P type semiconductor substrate 51. Selective oxide films 54A and 54B, which are formed by LOCOS, constitute a second gate oxide film and an isolation film, respectively.

A gate electrode 56 is formed to extend over a gate oxide film 55 and the above second gate oxide film 54A. A highly doped N⁺ source layer 57B is formed to be adjacent to the gate electrode 56. A highly doped N⁺ layer drain layer 58B is formed apart from the gate electrode 56.

As shown in FIG. 17, the conventional semiconductor device described above is a single side LDD structure semiconductor device having the drift region (LN layer 53B) which is diffused deep to surround the drain region 58B in order to realize a high breakdown voltage.

In the semiconductor device having the single side LDD structure as described above, the drift region 53B which has high resistance was a cause of reducing the driving capability.

In the semiconductor device having the single side LDD structure in which a high voltage is applied to only the side of the drain region, on the side of the drain region, in order to relax the concentration of an electric field, the highly doped drain region 58B was surrounded by the lightly doped drift region (LN layer 53B), whereas only the highly doped source region 57B was present on the side of the source region.

Even with the semiconductor device having such a structure, a static breakdown voltage was not particularly problematic. However, in operation, the following problems occurred. In the bipolar structure consisting of a source region (emitter region), a substrate (base region) and a drain region (collector region), because the highly doped source region 57 is naked, the emitter region has high efficiency of carrier injection. Therefore, the substrate current Isub is so large that the bipolar transistor is likely to turn on.

Thus, since the current gain β in the bipolar transistor is high, the drain breakdown voltage in operation falls more greatly than the semiconductor device having a double side LDD structure.

In order to improve the drain breakdown voltage in operation, the substrate current Isub must be decreased. Namely, the drain field must be further decreased.

However, when the impurity concentration of the entire lightly doped drift region (LN layer 53B) is decreased for the purpose of decreasing the substrate current Isub, as shown by solid line in FIG. 18, the substrate current Isub has a double hump structure that two peaks (1) and (2) appear as the voltage Vgs increases.

In this case, where the pertinent lightly doped drift region (LN layer 53B) has a lower concentration, the first peak (1) of the substrate current Isub is low so that the drain voltage at a low Vgs is improved. On the other hand, the second peak (2) of the substrate current Isub is relatively high so that the drain voltage at a high Vgs is attenuated.

On the contrary, when the entire lightly doped drift region (LN layer 53B) is increased, as shown by one-dot chain line in FIG. 18, the substrate current Isub has a single peak at a certain voltage Vgs. This is efficient to improve the drain voltage at a high Vgs, but attenuates the drain voltage at a low Vgs.

In this way, if the impurity concentration of the entire lightly doped drift region (LN layer 53B) is decreased, the "trade-off" relationship between the drain voltage at the low Vgs and that at the high Vgs cannot be overcome.

Further, the double side LDD structure which has been commonly used decreases the current gain β so that the breakdown voltage can be certainly improved. However, a high breakdown voltage is not essentially required on the side of the source region. In this case, if the general LDD structure is adopted also on the side of the source region, it has the same distance (L) of the drift region as that on the side of the drain region. This increases the ON resistance and attenuates the driving capability.

SUMMARY OF THE INVENTION

The invention is made to solve the problem and a semiconductor device (a high-withstand voltage MOS transistor) according to the invention is characterized in that it is provided with a gate electrode formed so that the gate electrode ranges from a first gate oxide film formed on a semiconductor layer of a first conductive type to a second gate oxide film, a second conductive type of source region formed so that the source region is adjacent to the gate electrode, a second conductive type of drain region formed in a position apart from the gate electrode and a second conductive type of drift region formed so that the drift region surrounds the drain region and the resistance value of the drift region is reduced by forming a higher density impurities layer of a second conductive type in the drift region.

The semiconductor device according to the invention is also characterized in that the second conductive type of impurities layer is formed so that the impurities layer ranges at least from one end of the drain region to one end of the gate electrode.

Further, a method of manufacturing the semiconductor device is characterized in that the semiconductor device is manufactured according to the following process. First, a layer of a second conductive type is formed by implanting and diffusing impurities of a second conductive type into a semiconductor layer of a first conductive type. An oxidation-resistant film is formed in a predetermined region on the semiconductor layer and further, a resist film is formed in a predetermined region on the semiconductor layer including the oxidation-resistant film. Next, impurities of a second conductive type are implanted using the oxidation-resistant film and the resist film as a mask to form an ion implanted layer in a predetermined region on the semiconductor layer, after the resist film is removed, the semiconductor layer is locally oxidized using the oxidation-resistant film as a mask to form a selective oxide film and the ion implanted layer is diffused to form a second conductive type of impurities layer. Next, the semiconductor layer is thermally oxidized using the selective oxide film as a mask to form a gate oxide film and a gate electrode is formed so that the gate electrode ranges from the gate oxide film to the selective oxide film. Impurities of a second conductive type are implanted using the gate electrode and the selective oxide film as a mask to form a source region of a second conductive type so that the source region is adjacent to the gate electrode and a second conductive type of drain region is formed in a position apart from the gate electrode.

The method of manufacturing the semiconductor device is also characterized in that the second conductive type of impurities layer is formed in the same process as a channel stopper layer forming process formed under an element isolation film of a normal-withstand voltage MOS transistor.

Further, in accordance with the second aspect of this invention, in the semiconductor device comprising a gate electrode formed to extend from a first gate oxide formed a semiconductor layer of the first conduction type onto a second gate oxide film having a larger thickness than that of said first gate oxide film, a source region of a second conduction type formed to be adjacent to the gate electrode, a drain region of the second conduction type formed at a position apart from said gate electrode and a drift region of the second conduction type formed so as to surround said drain region, it is characterized in that an impurity region of the second conduction type which is more lightly doped than said drain region and is more highly doped than said drift region is formed so as to surround the vicinity of said highly doped drain region.

In accordance with the second aspect of this invention, in the method of manufacturing a semiconductor device, a first ion-implanted layer is formed by ion-implanting impurities of the second conduction type into a semiconductor layer of the first conduction type and the implanted impurities are diffused into the semiconductor layer, thereby forming a lightly doped drift layer of the second conduction type. Thereafter, a second ion-implanted layer is formed by ion-implanting the impurities of the second conduction type in the drift layer. Subsequently, an oxidation-resistant film is formed in a prescribed region on said semiconductor layer and a resist film is formed in a prescribed region on said semiconductor layer inclusive of said oxidation-resistant film. Thereafter, impurities of the first conduction type are ion-implanted using as a mask said oxidation-resistant film and said resist film, thereby forming a third ion-implanted layer in a prescribed region on said semiconductor layer. Next, after said resist film has been removed, said semiconductor layer is LOCOS-oxidized using said oxidation-resistant film as a mask to form a selective oxide film and an isolation film. Also, the impurities implanted in said second and said third ion-implanted layer are diffused into the semiconductor layer, thereby forming an impurity layer of the second conduction type. Further, a channel stopper layer of the first conduction type is formed beneath the isolation film. The surface of said semiconductor layer is thermally oxidized using as a mask said selective oxide film and said isolation film to form a gate oxide film and a gate electrode to extend from said gate oxide film onto said selective oxide film. Further, the impurities of the second conduction type are ion-implanted using as a mask said gate electrode and said selective oxide film, thereby forming a highly doped source region of the second conduction type formed to be adjacent to said gate electrode and also forming a highly doped drain region of the second conduction type at a position apart from said gate electrode.

In this way, since the impurity region of the second conduction type which is more lightly doped than said drain region and is more highly doped than said drift region is formed so as to surround the vicinity of said highly doped drain region, the distribution of the impurity concentration is not evenly varied in the lightly doped drift region so that the lightly doped drift region can have a low Vgs breakdown voltage whereas the impurity layer of the second conduction type which is more highly doped than the lightly doped drift layer can have a high Vgs breakdown voltage.

Further, said impurity layer of the second conduction type is formed in the same step of forming a channel stopper layer of the second conduction type beneath the isolation film formed between the second conduction channel type MOS transistor thus made and a first conduction channel type MOS transistor which is placed mixedly therewith.

PREFERRED EMBODIMENT OF THE INVENTION

Figure 1:
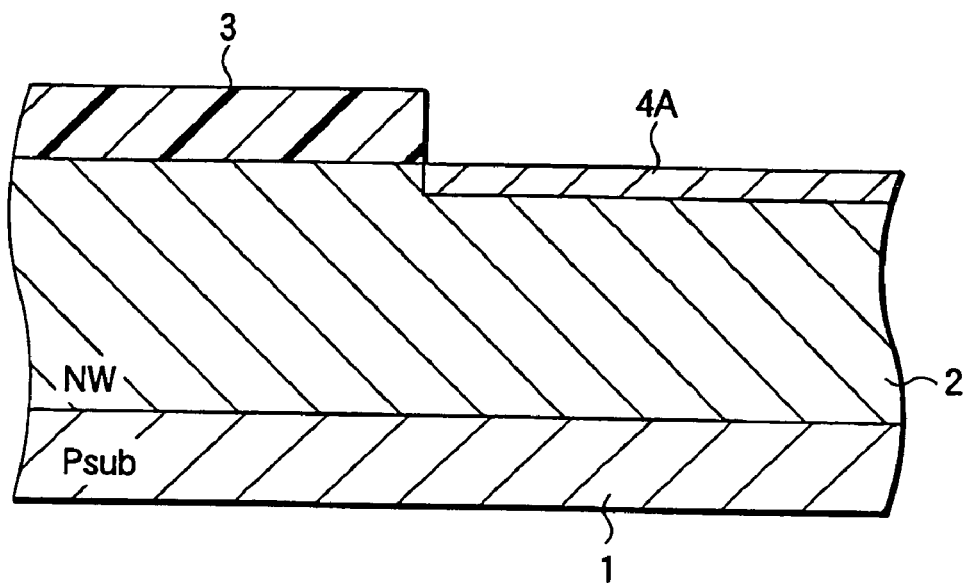
FIGS. 1 to 7 are sectional views for showing a method of manufacturing a semiconductor device according to the first embodiment of the invention.

Referring to the drawings, a first embodiment related to a semiconductor device and a method of manufacturing it according to the invention will be described below.

FIGS. 1 to 7 are sectional views showing a method of manufacturing a high-withstand voltage P channel type MOS transistor according to the invention First, as shown in FIG. 1, an N-type well region 2 (NW) is formed by implanting and diffusing N-type impurities into a desired region of a P-type semiconductor substrate (Psub) 1 for example. In this process, for the N-type impurities, for example, phosphorus ions are implanted at the accelerating voltage of approximately 160 KeV on the implantation condition of $5 \times 10^{12}/cm^2$ and are thermally diffused at approximately 1200° C. for 16 hours.

Figure 2:
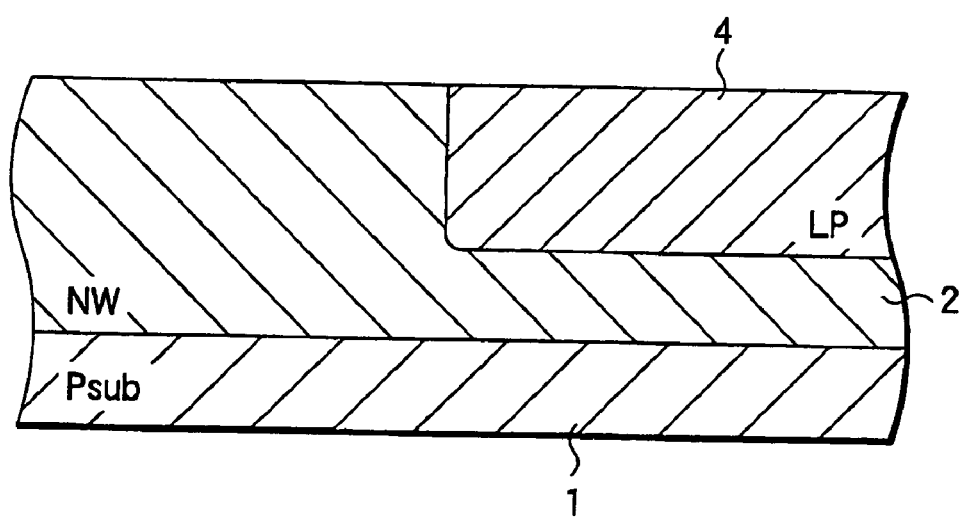

Next, P-type impurities are implanted into a desired region of the substrate 1 using a resist film 3 formed on the substrate 1 as a mask to form an ion implanted layer 4A. A low-density P-type layer 4 (hereinafter called an LP layer 4) is formed by diffusing the implanted impurities as shown in FIG. 2. The LP layer 4 composes a drift region. In this process, for P-type impurities, for example, boron ions are implanted at the accelerating voltage of approximately 80 KeV on the implantation condition of $1.2 \times 10^{13}/cm^2$ and are thermally diffused at approximately 1100° C. for four hours.

Figure 3:
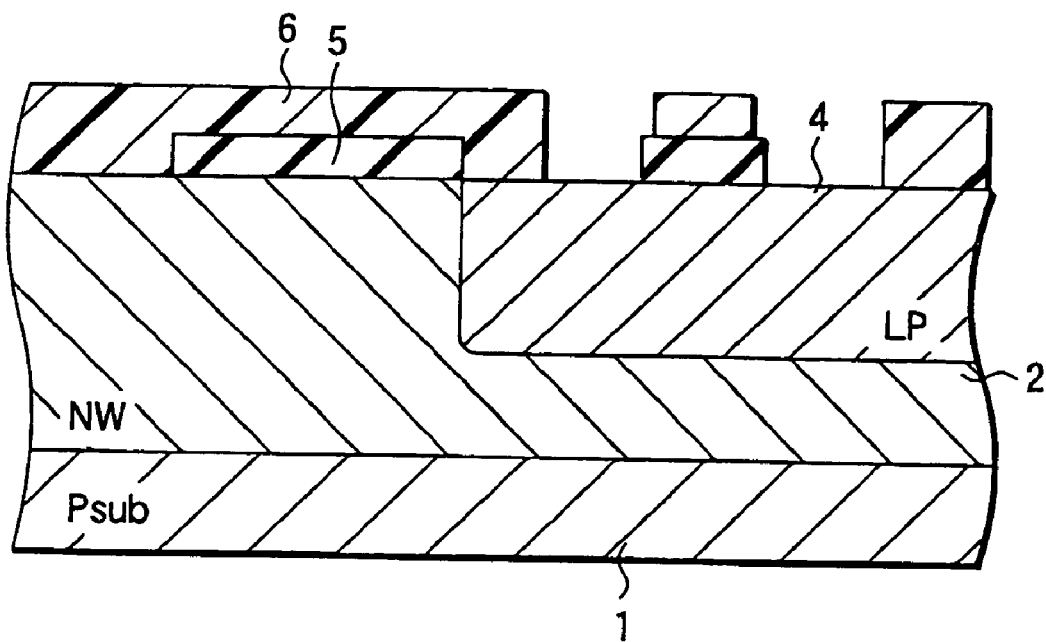
Figure 4:
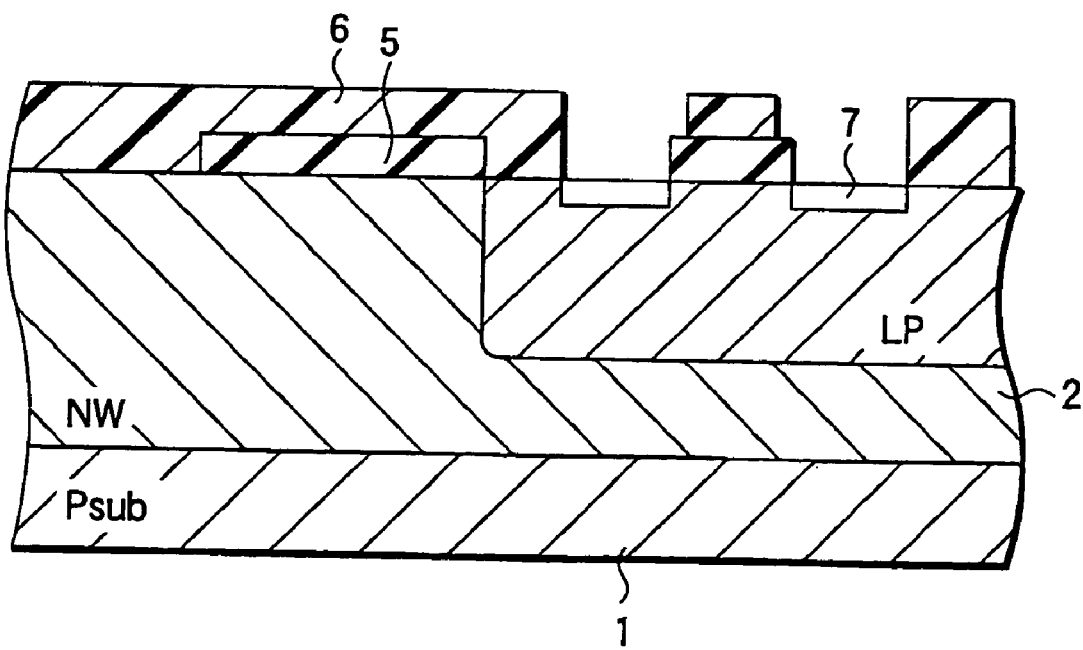

Next, as shown in FIG. 3, a silicon nitride (SiN) film 5 and a resist film 6 are respectively patterned on a predetermined region of the substrate 1.

Figure 5:
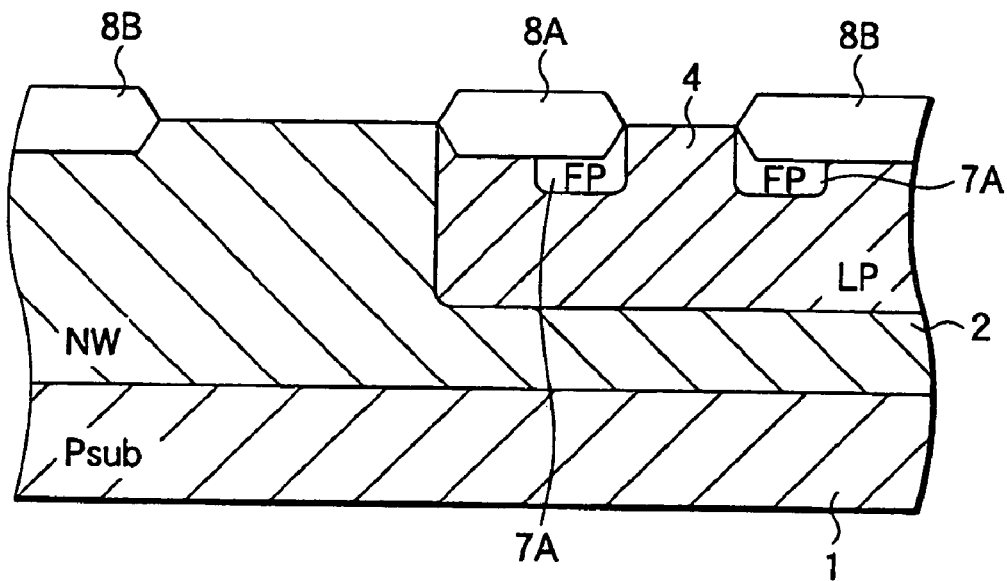

Further, P-type impurities are implanted using the silicon nitride film 5 and the resist film 6 as a mask to form an ion implanted layer 7. After the resist film 6 is removed as shown in FIG. 5, the surface of the substrate is locally oxidized using the silicon nitride film 5 as a mask, and a selective oxide film 8A (included in a gate oxide film) having the thickness of approximately 800 nm and a local oxide film 8B (composing an element isolation film) are formed. In the LOCOS, the boron ions in the ion implanted layer 7 are diffused, an FP layer 7A is formed in the drift region (the LP layer 4) and a channel stopper layer (not shown) is formed under the element isolation film (the local oxide film 8B). That is, as the FP layer 7A is formed in a process for forming the channel stopper layer under the element isolation film of a normal-withstand voltage (for example, 5V) N-channel MOS transistor (not shown), a new manufacturing process is not required to be provided to form the FP layer 7A. In this process, for P-type impurities, for example, boron ions are implanted at the accelerating voltage of approximately 80 KeV on the implantation condition of $1.2 \times 10^{13}/cm^2$ and are thermally diffused in heat treatment (at approximately 1000° C.) in LOCOS.

Figure 6:
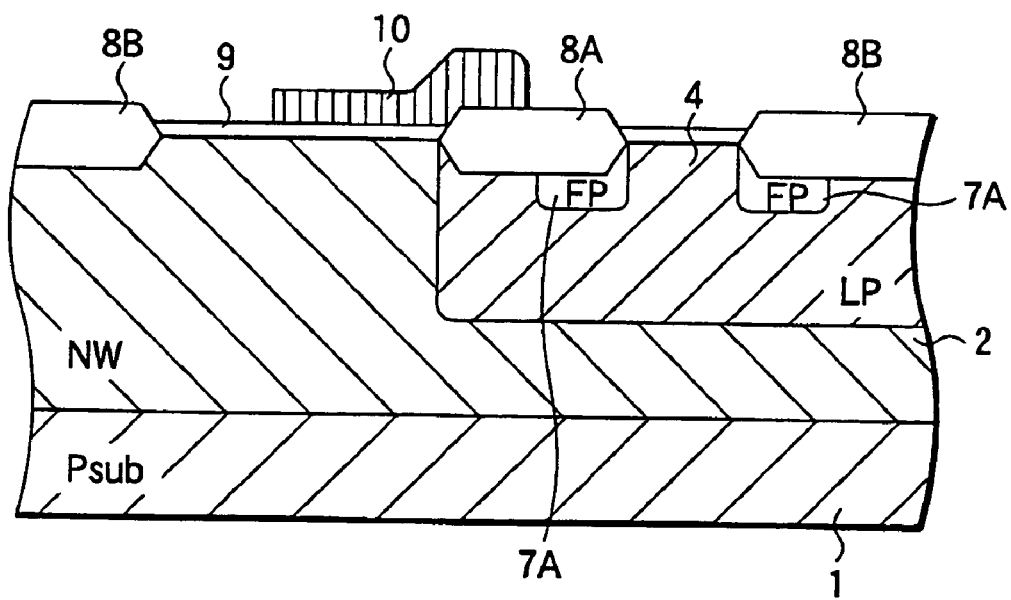

Next, as shown in FIG. 6, a gate oxide film 9 having the thickness of approximately 45 nm is formed in a region except the selective oxide film 8A and the local oxide film 8B by thermally oxidizing the substrate 1, and a gate electrode 10 is formed to be approximately 400 nm thick so that the gate electrode ranges from the gate oxide film 9 to the selective oxide film 8A. The gate electrode 10 in this embodiment is composed of a polysilicon film made conductive by doping phosphorus from $POCl_3$ as a thermal diffusion source. Further, a polyside electrode may be also formed by laminating a tungsten silicide (WSix) film and others on the polysilicon film.

Figure 7:
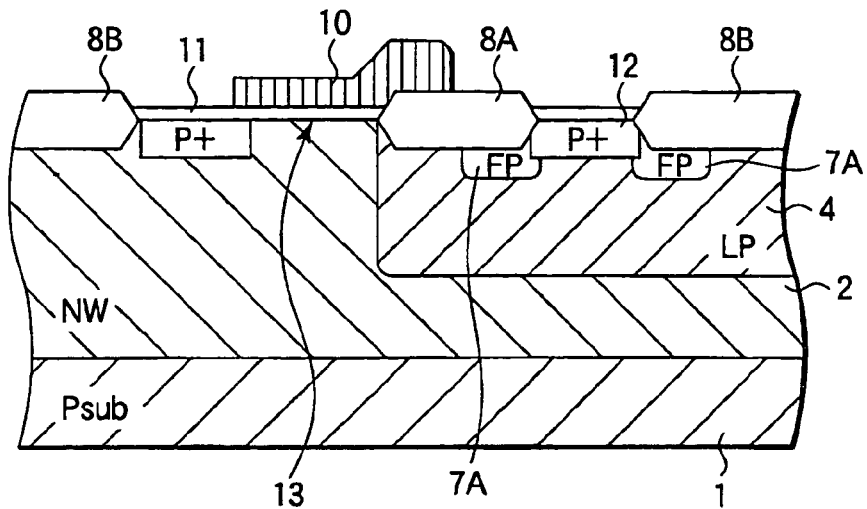
Figure 8:
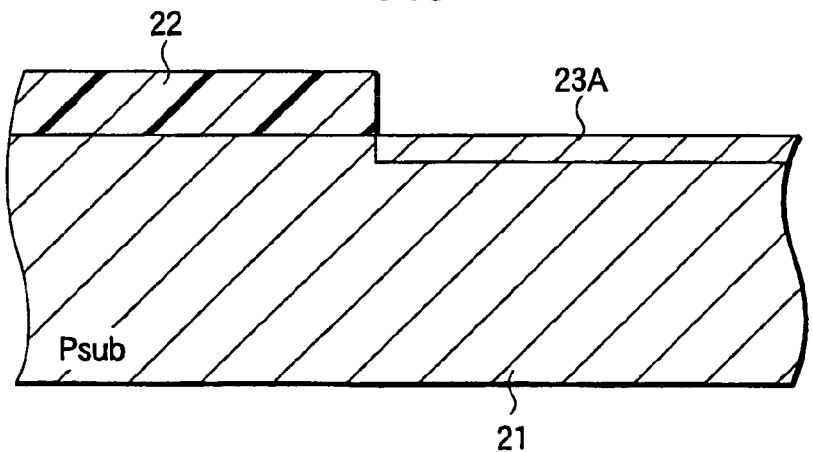
FIGS. 8 to 14 are sectional views for showing a method of manufacturing a semiconductor device according to the second embodiment of this invention.

Next, as shown in FIG. 7, P-type impurities are doped using the gate electrode 10, the selective oxide film BA and the local oxide film 8B as a mask to form a P$^+$ type diffused region 11 (hereinafter called a source region 11) and a P$^+$ type diffused region 12 (hereinafter called a drain region 12). In this process, for example, boron ions are implanted by the quantity of $1 \times 10^{15}/cm^2$ at the accelerating voltage of approximately 35 KeV and further, source/drain regions having so-called DDD structure are formed by implanting boron difluoride ions for example by the quantity of $2 \times 10^{15}/cm^2$ at the accelerating voltage of approximately 80 KeV. Further the structure of the source/drain regions 11 and 12 are not limited to the DDD structure and may also have so-called LDD structure.

A layer insulation film is formed overall the substrate though it is not shown and after a source electrode and a drain electrode are formed via the layer insulation film, a passivation film not shown is formed and the semiconductor device is completed.

As described above, according to the invention, the resistance value of the drift region can be lowered without deteriorating the withstand voltage by respectively forming higher density impurities layers (FP layers 7A) in regions in the drift region (the LP layer 4) formed so that the drift region surrounds the drain region 12 from the vicinity of a channel region 13 under the gate electrode 10. Therefore, the ON-state resistance of the high-withstand voltage MOS transistor can be reduced.

Further, as the ON-state resistance can be reduced as described above, the gate width (GW) of the high-withstand voltage MOS transistor can be reduced and area which the transistor occupies can be reduced.

Also, in the invention, as the FP layer 7A is formed in the same process as the channel stopper layer forming process for forming the channel stopper layer under the element isolation film of the normal-withstand voltage MOS transistor (for example, an N-channel MOS transistor of 5V), the number of the manufacturing processes is not increased.

According to the invention, the resistance value of the drift region can be lowered without deteriorating the withstand voltage by respectively forming the higher density impurities layers in the regions in the drift region formed so that the drift region surrounds the drain region and the reduction of the ON-state resistance is enabled.

Also, as described above, as the reduction of the ON-state resistance is enabled, the gate width (GW) of the transistor can be reduced and the area which the transistor occupies can be reduced.

Further, according to the invention, as the high density impurities layer formed in the drift region is formed in the same process as the channel stopper layer forming process for forming under the element isolation film of the normal-withstand voltage transistor, no problem that the number of the manufacturing processes is increased occurs. Now referring to the drawings, an explanation will be given of the second embodiment of a semiconductor device and its manufacturing method according to this invention.

Embodiment 2

FIGS. 8 to 14 are sectional views for showing, in the order of steps, a method of manufacturing a P-channel high voltage MOS transistor to which this invention is applied. First, in FIG. 8, using as a mask a resist film 22 formed on e.g. a P-type semiconductor substrate 21, N-type impurities are ion-implanted in a desired region of the substrate 21 to form a first ion-implanted layer 23A.

Figure 9:
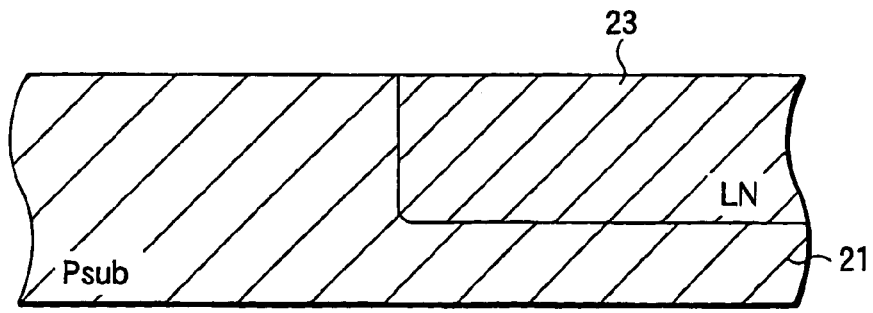

As seen from FIG. 9, after the resist film 22 has been removed, the impurities within the first ion-implanted layer 23 are diffused to form a lightly doped N-type layer 23 (hereinafter referred to as "LN layer 23"). Now, the LN layer constitutes a lightly doped drift region. Incidentally, in this step, phosphorus ions as N-type impurities are ion-implanted at an accelerating voltage of 100 KeV and with a dose of about $6.5 \times 10^{12}/cm^2$ and thermally diffused for four hours at 1100° C.

Figure 10:
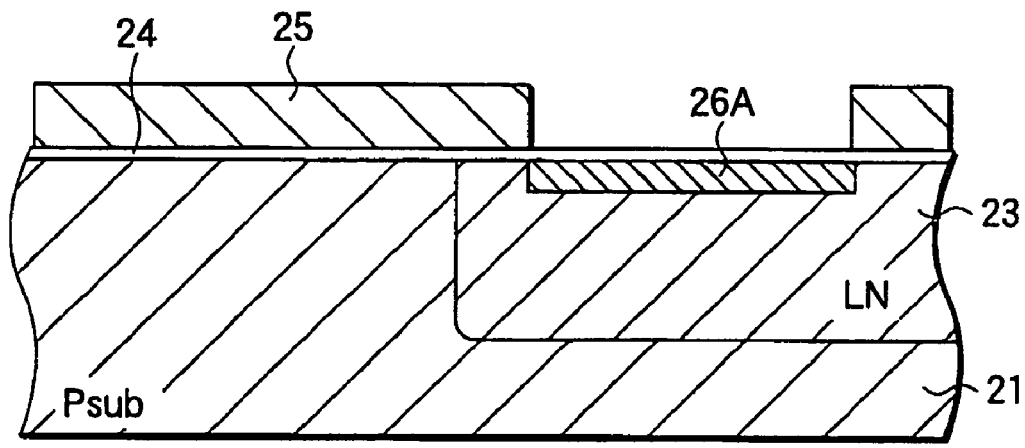

In FIG. 10, using, as a mask, a pad oxide film 24 formed on the substrate 21 and a resist film 25 having an opening on the above LN layer, N-type impurities are ion-implanted in a desired region of the LN layer 23 to form a second ion-implanted layer 26A. Incidentally, in this step, phosphorus ions as N-type impurities are ion-implanted at an accelerating voltage of about 160 KeV and with a dose of about $5.0 \times 10^{13}/cm^2$. The pad oxide film 24 serves to suppress that a damaged layer is formed on the substrate surface layer during ion-implantation. The impurities within the second ion implanted layer 26A formed in the prescribed region of the LN layer 23 are diffused into the substrate by heat treatment when a selective oxide film 30A and an isolation film 30B are formed as described later, thereby forming an N-type layer 26. More specifically, this N-type layer is formed in such a manner that a channel stopper layer (not shown) which is an N-type impurity layer is formed on the side of a P-channel type MOS transistor in order that the P-channel type MOS transistor and an N-channel type MOS transistor (high voltage MOS transistor in this embodiment) are isolated from each other.

Figure 11:
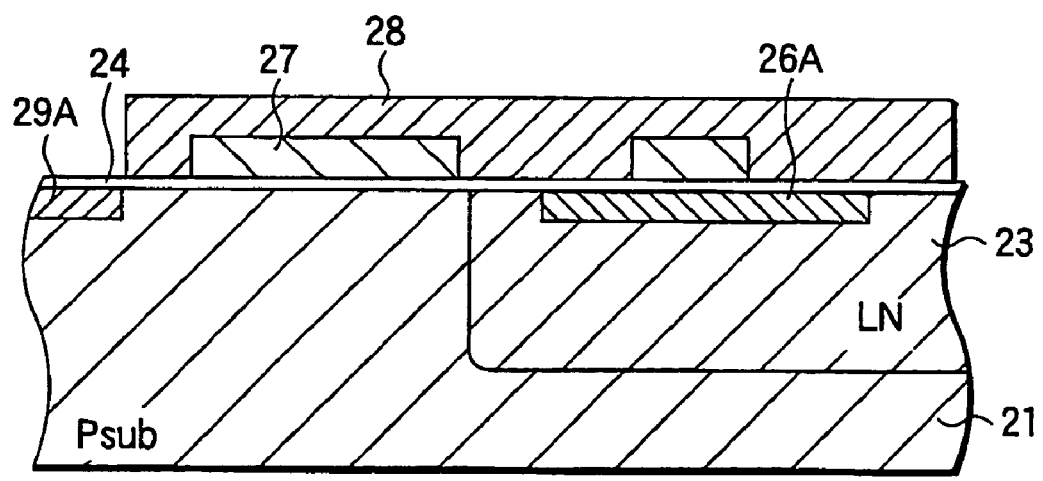

In FIG. 11, after the resist film 22 has been removed, a silicon nitride film 27 and a resist film 28 are patterned on prescribed regions of the substrate 1. Using as a mask the silicon nitride film 27 and resist film 28, P-type impurities are ion-implanted to form a third ion-implanted layer 29A on a prescribed region of the substrate 21. Incidentally, in this step, boron ions as P-type impurities are ion-implanted at an accelerating voltage of about 100 KeV and with a dose of about $5.0 \times 10^{13}/cm^2$. The impurities within the third ion-implanted layer 29A formed on a prescribed region of the substrate 21 are diffused into the substrate by heat treatment when the selective oxide film 30A and the isolation film 30B are formed as described later, thereby forming a channel stopper layer (P-type layer 29) on the side of the N-channel type MOS transistor so that the N-channel type MOS transistor and P-channel type MOS transistor are isolated from each other.

Figure 12:
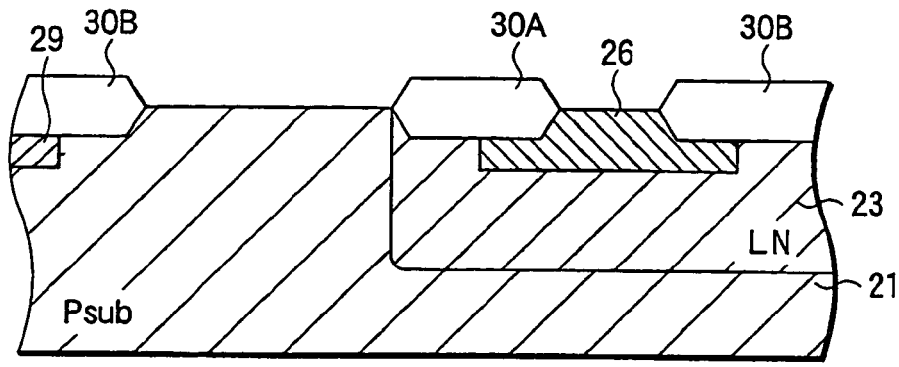

As seen from FIG. 12, after the resist film 28 has been removed, using the silicon nitride film 27 as a mask, the substrate surface is LOCOS-oxidized to form a selective oxide film 30A (constituting a second gate oxide film) having a thickness of about 800 nm and an isolation film 30B. By the heat treatment during the LOCOS oxidation, the phosphorus ions within the second ion-implanted layer are diffused to form an N-type layer 26 within the drift region (LN layer 23). Simultaneously, the boron ions within the third ion-implanted layer 29A are diffused to form a P-type layer serving as a channel stopper 29A beneath the isolation film 30B. In other words, the N-type layer 26 is formed by diverting the step of forming the channel stopper layer beneath the isolation film of the P-channel type MOS transistor (e.g. P-channel type MOS transistor having an usual voltage of about 5 V) which is placed mixedly with the N-channel type high voltage MOS transistor according to this embodiment. For this reason, a new step for forming the N-type layer 26 will not be added to the number of manufacturing steps.

Figure 13:
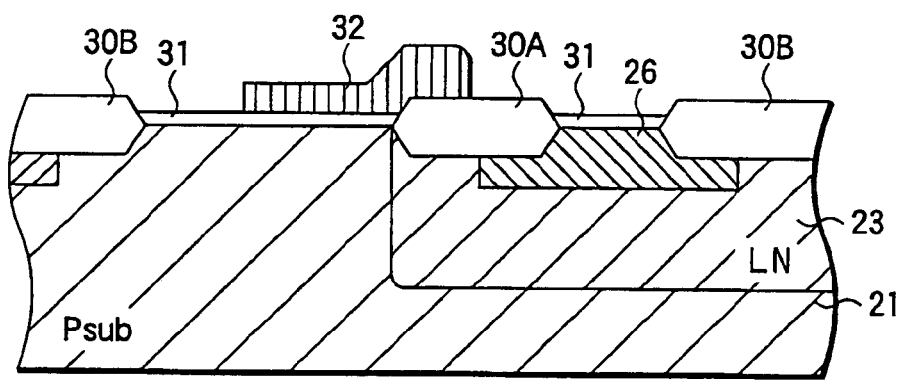

Subsequently, in FIG. 13, the surface of the substrate 21 is thermally oxidized to form a first gate oxide film 31 having a thickness of about 45 nm in an area other than the selective oxide film 30A and isolation film 30B. A gate electrode 32 having a thickness of about 400 nm is formed to extend from the first gate oxide film 31 onto the selective oxide film 30A (second gate oxide film). Incidentally, the gate electrode 32 is made of a poly-Si film which has been made conductive by phosphorus doping from a thermal diffusion source of $POCl_3$. Further, this gate electrode a polyside electrode which is made from e.g. a tungsten silicide ($WSi_x$) stacked on the poly-Si film.

Figure 14:
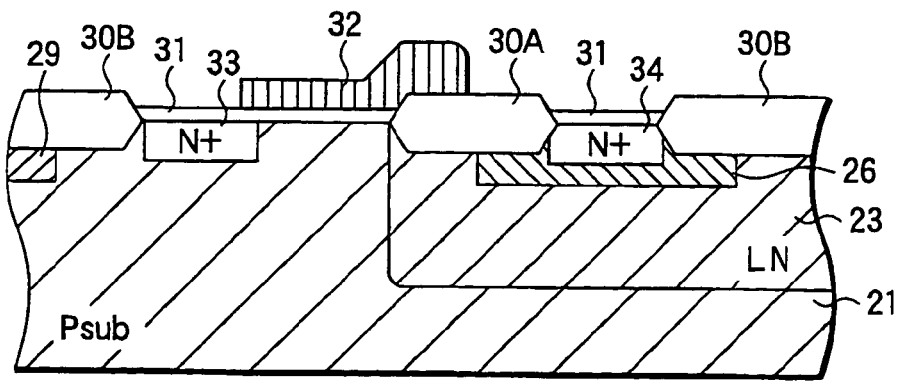
Figure 15:
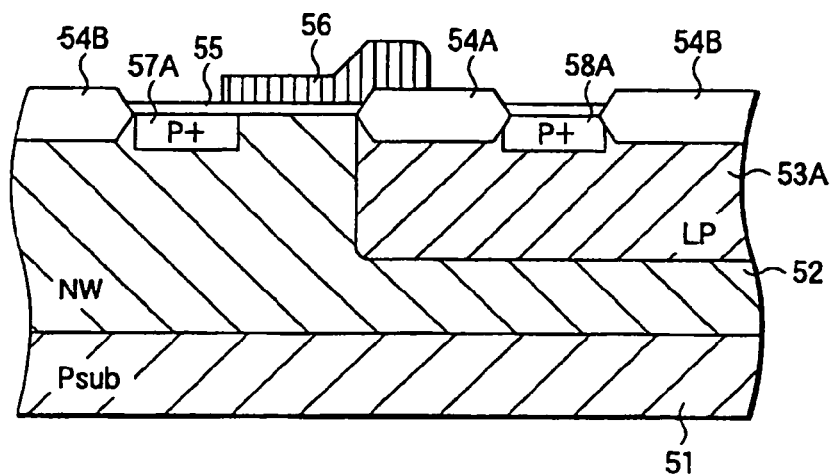
FIG. 15 is a section view showing a conventional semiconductor device.
Figure 17:
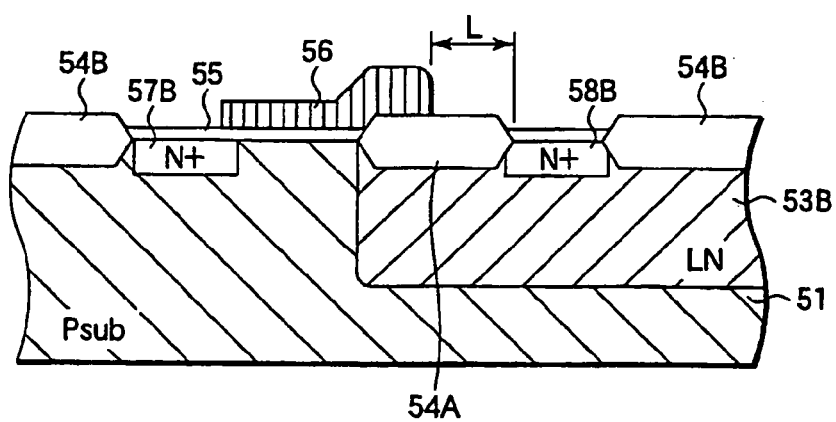
FIG. 17 is a section view showing a conventional semiconductor device.
Figure 16:
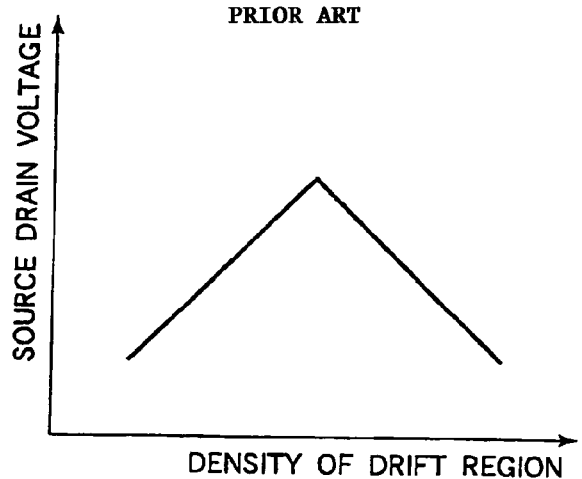
FIG. 16 is a graph for explaining a problem relative to the conventional semiconductor device.
Figure 18:
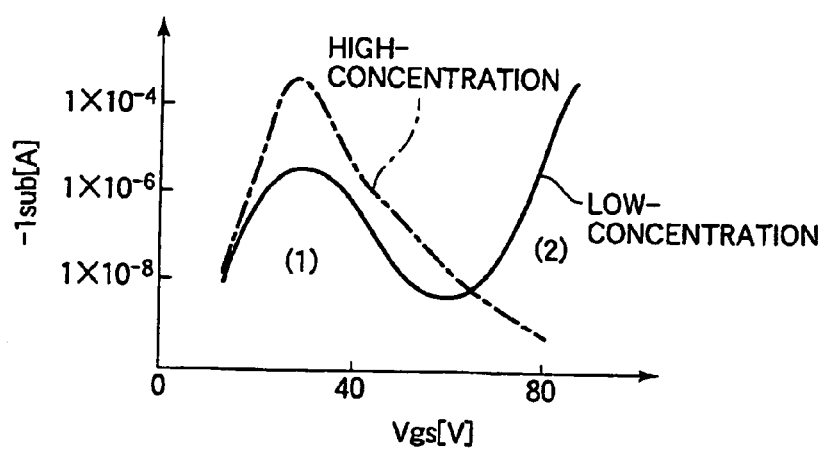
FIG. 18 is a graph for explaining a problem relative to the conventional semiconductor device.

Referring to FIG. 14, using, as a mask, the gate electrode 32, selective oxide film 30A and isolation film 30B, N-type impurities are implanted to form a highly doped N-type diffused region 33 (hereinafter referred to as a source region 33) and a highly doped N-type diffused region 34 (hereinafter referred to as a drain region 34). Incidentally, in this step, for example, phosphorus ions are implanted at an accelerating voltage of about 70 KeV and with a dose of about $1.0 \times 10^{14}/cm^2$. and further, for example, arsenic ions are implanted at an accelerating voltage of about 80 KeV and with a dose of about $6.0 \times 10^{15}/cm^2$, thereby forming source/drain regions in a "DDD structure". The source/drain regions 33, 34 should not be realized in only the DDD structure, but may be realized in a "LDD" structure.

In the following, although no explanation will be given of the illustrated structure, after an interlayer insulating film is formed on the entire substrate surface and a source and a drain electrode have been formed, a passivation film (not shown) is formed to complete the semiconductor device.

As understood from the description hitherto made, in accordance with this invention, within the drift region (LN layer 23) formed so as to surround the drain region 34, the N-type layer 26, which is more lightly doped than the drain region 34 and more highly doped than the drift region (LN layer 23), is formed so as to surround the vicinity of the drain region 34. For this reason, the resistance of the drift region can be reduced without attenuating the breakdown voltage. Thus, the ON resistance of the high voltage MOS transistor can be reduced.

Further, the ON resistance can be reduced so that the gate width (GW) of this high voltage MOS transistor can be decreased. For this reason, the area occupied by the transistor can be reduced.

Further, in accordance with this invention, the N-type layer 26 can be formed by diverting the step of forming the channel stopper layer which is the N-type impurity layer beneath the isolation film of the P-channel type MOS transistor which is placed together with the N-channel type MOS transistor. This reduces the number of manufacturing steps and hence contributes to improvement of workability.

Further, as seen from FIG. 14, the N-type layer 26 is formed so as to surround the vicinity of the highly doped drain region evenly to positions which is adjacent to the one end of the gate electrode 32 through the second gate oxide film 30A and to the one end of the isolation film 30B. For this reason, the vicinity of the drain region 34 can have an even distribution of the impurity concentration, thereby avoiding local concentration of an electric field due to a local change in the distribution of the impurity concentration. In accordance with this invention, the impurity layer, which is more lightly doped than the drain region and more highly doped than the drift region, is formed so as to surround the vicinity of the highly doped region formed in the drift region. For this reason, the resistance of the drift region can be reduced without attenuating the breakdown voltage. Thus, the ON resistance of the transistor can be reduced.

Further, the ON resistance can be reduced so that the gate width (GW) of the transistor can be decreased. For this reason, the area occupied by the transistor can be reduced.

Further, in accordance with this invention, the impurity layer, which is to be formed so as to surround the vicinity of the highly doped drain region formed within the drift region, is formed by diverting the step of forming the channel stopper layer which is the N-type impurity layer beneath the isolation film of the other channel type MOS transistor which is placed together with the one channel type MOS transistor. This does not lead to the problem of an increase in the number of manufacturing steps.

Incidentally, it should be noted that in the embodiments described above, although ion-implantation was used in order to form the impurity regions, diffusion from a solid phase or vapor phase may be used.

What is claimed is:

1. A semiconductor device comprising:
    a semiconductor layer of a first conductive type;
    a first gate oxide film and a second gate oxide film formed on the semiconductor layer;
    a gate electrode formed to range from the first gate oxide film to the second gate oxide film;
    a source region of a second conductive type formed adjacent to the gate electrode;
    drain region of the second conductive type formed in a position apart from the gate electrode;
    a drift region of the second conductive type formed so that the drift region surrounds the drain region; and
    an impurities layer of the second conductive type formed adjacent to the drain region,
    wherein the impurities layer is more highly doped than the drift region, which extends deeper into the semiconductor layer than the impurities layer; and
    wherein the drain region is in direct contact with the drift region.

2. A semiconductor device according to claim 1, wherein:
    said impurities layer is formed to range at least from one end of the drain region to one end of the gate electrode.

3. A semiconductor device according to claim 2, wherein:
    said impurities layer is formed in a surface of the drift region so that it is located between one end of the drain region and one end of the gate electrode.

4. A semiconductor device comprising:
    a semiconductor layer of a first conduction type;
    a first gate oxide film and a second gate oxide film formed on the semiconductor layer;
    a gate electrode formed to extend from the first gate oxide film to the second gate oxide film having a larger thickness than that of said first gate oxide film;
    a source region of a second conduction type formed to be adjacent to the gate electrode;
    a drain region of the second conduction type formed at a position apart from said gate electrode; and
    a drift region of the second conduction type formed so as to surround said drain region;
    wherein an impurity region of the second conduction type, which is more lightly doped than said drain region and is more highly doped than said drift region, is formed so as to surround the vicinity of said highly doped drain region,
    wherein the drift region extends deeper into the semiconductor layer than the impurity region; and
    wherein the drain region is in direct contact with the drift region.

5. A semiconductor device according to claim 4, wherein said impurity region of the second conduction type is formed to extend from at least one end of said drain region and to be adjacent to one end of said gate electrode.

6. A semiconductor device according to claim 4, wherein said impurity region of the second conduction type is formed evenly in depth so as to be adjacent to one end of said gate electrode through said first gate oxide film and to surround the vicinity of said drain region.

7. A semiconductor device comprising:
    a semiconductor layer of a first conductive type;
    a first gate oxide film and a second gate oxide film formed on the semiconductor layer;
    a gate electrode formed to range from the first gate oxide film to the second gate oxide film;
    a source region of a second conductive type formed adjacent to the gate electrode;
    drain region of a second conductive type formed in a position apart from the gate electrode;
    a drift region of the second conductive type formed so that the drift region surrounds the drain region; and
    an impurities layer of the second conductive type formed adjacent to the drain region,
    wherein the impurities layer is more highly doped than the drift region, which extends deeper into the semiconductor layer than the impurities layer;
    wherein the drain region is in direct contact with the drift region; and
    wherein said impurities layer is formed to range at least from one end of the drain region to one end of the gate electrode and is formed in a surface of the drift region.

* * * * *